United States Patent
Mihaila et al.

(10) Patent No.: US 10,164,126 B2
(45) Date of Patent: Dec. 25, 2018

(54) JUNCTION BARRIER SCHOTTKY DIODE WITH ENHANCED SURGE CURRENT CAPABILITY

(71) Applicant: ABB Schweiz AG, Baden (CH)

(72) Inventors: Andrei Mihaila, Baden (CH); Munaf Rahimo, Uezwil (CH); Renato Minamisawa, Windisch (CH); Lars Knoll, Wohlenschwil (CH); Liutauras Storasta, Lenzburg (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/861,230

(22) Filed: Jan. 3, 2018

(65) Prior Publication Data
US 2018/0212071 A1 Jul. 26, 2018

Related U.S. Application Data

(63) Continuation of application No. PCT/EP2016/065681, filed on Jul. 4, 2016.

(30) Foreign Application Priority Data

Jul. 3, 2015 (EP) .................................... 15175299
Oct. 5, 2015 (EP) .................................... 15188372

(51) Int. Cl.
*H01L 29/06* (2006.01)
*H01L 29/872* (2006.01)
(Continued)

(52) U.S. Cl.
CPC ........ *H01L 29/872* (2013.01); *H01L 29/0619* (2013.01); *H01L 29/0688* (2013.01);
(Continued)

(58) Field of Classification Search
CPC ... H01L 27/07; H01L 27/0711; H01L 27/0744
See application file for complete search history.

(56) References Cited

U.S. PATENT DOCUMENTS 8,232,558 B2 7/2012 Zhang et al.
8,841,683 B2 9/2014 Mizukami
(Continued)

OTHER PUBLICATIONS

European Patent Office, International Search Report & Written Opinion issued in corresponding Application No. PCT/EP2016/065681, dated Oct. 28, 2016, 12 pp.
(Continued)

*Primary Examiner* — Cheung Lee
(74) *Attorney, Agent, or Firm* — J. Bruce Schelkopf; Taft Stettinius & Hollister LLP

(57) ABSTRACT

A semiconductor power rectifier with increased surge current capability is described. A semiconductor layer includes a drift layer having a first conductivity type, at least one pilot region having a second conductivity type different from the first conductivity type, a plurality of stripe-shaped emitter regions having the second conductivity type, and a transition region having the second conductivity type, wherein the at least one pilot region has in any lateral direction parallel to the first main side a width of at least 200 μm and is formed adjacent to the first main side to form a first p-n junction with the drift layer, each emitter region is formed adjacent to the first main side form a second p-n junction with the drift layer, and the transition region is formed adjacent to the first main side to form a third p-n junction with the drift layer.

20 Claims, 11 Drawing Sheets

(51) Int. Cl.
*H01L 29/08* (2006.01)
*H01L 29/16* (2006.01)
*H01L 29/20* (2006.01)

(52) U.S. Cl.
CPC ...... *H01L 29/0692* (2013.01); *H01L 29/0813* (2013.01); *H01L 29/1608* (2013.01); *H01L 29/2003* (2013.01)

(56) References Cited

U.S. PATENT DOCUMENTS

| | | |
|---|---|---|
| 2004/0173801 A1 | 9/2004 | Willmeroth |
| 2012/0241762 A1 | 9/2012 | Noda et al. |
| 2014/0327019 A1 | 11/2014 | Kinoshita et al. |

OTHER PUBLICATIONS

European Patent Office, Extended Search Report issued in corresponding Application No. 15188372.5, dated Apr. 15, 2016, 9 pp.
Rupp et al., "Current distribution in the various functional areas of a 600V SiC MPS diode in forward operation," Materials Science Forum, vols. 717-720, 2012, pp. 929-932.

JUNCTION BARRIER SCHOTTKY DIODE WITH ENHANCED SURGE CURRENT CAPABILITY

FIELD OF THE INVENTION

The present invention relates to a power semiconductor rectifier and more particularly to a Junction Barrier Schottky (JBS) diode.

BACKGROUND OF THE INVENTION

High power semiconductor rectifiers are key components in power electronic systems, such as high-voltage direct current (HVDC) electric power transmission systems, control electronics, power supplies and motor drives. A higher electric breakdown field strength, a higher thermal conductivity, a lower intrinsic carrier concentration and a higher saturated drift velocity compared to silicon make silicon carbide (SiC) a favorable material for high-power devices. Silicon carbide based rectifiers can be made with a significantly thinner drift layer compared to silicon based rectifiers having the same blocking voltage due to the higher electric breakdown field strength of silicon carbide compared to that of silicon. Known semiconductor rectifiers include P-i-N diodes, Schottky diodes and Junction Barrier Schottky (JBS) diodes. The Schottky diode is a unipolar diode, in which the current conduction is governed by majority carriers (electrons). It offers a relatively high switching speed but has a higher leakage current compared to a P-i-N diode constructed from the same semiconductor material. The lower switching speed of the P-i-N diode compared to that of a Schottky diode made from the same semiconductor material is due to a higher reverse recovery charge resulting from minority (holes) and majority (electrons) carriers being involved in the current conduction. The JBS diode can combine a low threshold voltage and high switching speed similar to that of a Schottky diode with good blocking characteristics similar to that of a P-i-N diode. It has the structure of a Schottky diode with a p-n junction grid integrated into its drift region.

Silicon Schottky diodes are not used as high-power rectifiers because of their low blocking capability. SiC Schottky diodes have a much lower reverse leakage current and a higher reverse (or blocking) voltage than silicon Schottky diodes. Compared to a SiC P-i-N diode, a SiC Schottky diode has the advantage of a lower threshold voltage and lower switching losses due to a lower reverse recovery charge.

SiC Schottky diodes are commercially available since 2001, challenging established silicon P-i-N diodes in applications from 300V to 3.3 kV. Depending on the application, SiC rectifiers may be required to handle various levels of surge currents, sometimes as high as 10 times the value of the nominal current rating. In case of such high surge currents the SiC Schottky diode may be destroyed by the heat generation due to thermal losses in the Schottky junction.

A SiC semiconductor rectifier with improved blocking characteristics and surge current capability compared to the SiC Schottky diode is a SiC JBS diode. In FIG. 1 a partial cross section of the known SiC JBS diode 10 is shown. It comprises a semiconductor wafer having a first main side 12 and a second main side 13. In an orthogonal projection onto a plane parallel to the first main side 12, the semiconductor wafer has an active region AR surrounded by an edge termination region TR. In the order from the second main side 13 to the first main side 12, the semiconductor wafer includes an $n^+$-type cathode layer 14 and an $n^-$-type drift layer 15. Adjacent to the first main side $p^+$-type emitter layer portions 16 form the p-n junction grid pattern, a $p^+$-type transition region 17 is formed in the active region AR along the boundary between the active region AR and the edge termination region TR. In the edge termination region TR a p-type junction termination extension (JTE) region 18 is formed adjacent to the first main side 12. On the first main side 12 a passivation layer 19 is formed in the edge termination region TR and overlapping with the transition region 17 in the orthogonal projection onto the plane parallel to the first main side 12. In the active area AR the first main side 12 is covered by metal electrode layer 21 forming a Schottky contact with the $n^-$-type drift layer 15 and forming an ohmic contact with the $p^+$-type emitter layer portions 16 and with the $p^+$-type transition region 17. A top metal 22 is formed on the metal electrode layer 21. The metal electrode layer 21 and the top metal 22 overlap with and extend onto the passivation layer 19. On the second main side 13 there is formed a backside metallization 23 as an anode electrode. The electrode layer 21 is exemplarily made of titanium (Ti), nickel (Ni), tungsten (W), cobalt (Co) or a combination thereof. The top metal 22 is exemplarily made of aluminum (Al).

In operation the improved blocking characteristics of the SiC JBS diode is due to the fact that the depletion region, which extends from the p-n junction grid under reverse bias conditions can protect the Schottky contact from a high electric field, which can eventually result in premature breakdown due to increased leakage currents. The depletion layer extending from each pair of two neighbouring stripe-shaped $p^+$-type emitter layer portions 16 can pinch off the Schottky contact between these two neighbouring stripe-shaped $p^+$-type emitter layer portions 16.

In the JBS diode as shown in FIG. 1 the Schottky contacts have a lower threshold voltage than the p-n junctions. Therefore, during normal operation (flow of a current equal to or below the nominal current), under a relatively low forward bias, the current conduction is governed by the unipolar current flow through the Schottky contacts. In case of a surge current a higher voltage drop will develop over the device and the p-n junction grid switches into on-state so that bipolar current can flow through the p-n junction grid. The electrical resistance of the p-n junction is lower than that of the Schottky junction when holes are injected through the p-n junction into the drift layer. Accordingly, the p-n junction grid allows the flow of higher surge currents than SiC Schottky diode without a p-n junction grid.

From U.S. Pat. No. 8,232,558 B2 there is known a JBS diode comprising a p-type surge current protection region formed in an $n^-$-type drift layer in addition to stripe-shaped p-type JBS regions. The surge current protection region has a higher lateral width than the p-type JBS regions to increase the surge current capability. In U.S. Pat. No. 8,232,558 B2 there is not described any p-type transition region along the boundary to a termination region. Also, the p-type stripe-shaped emitter regions are separated from the p-type surge current protection region by the drift layer. The problem in the JBS diode disclosed in this prior art document is that a surge current may first (i.e. in an initial phase of a surge current) be concentrated in the protection region and result in local overheating of the device.

From the article "Current distribution in the various functional areas of a 600V SiC MPS diode in forward operation" by Rupp et al. in Materials Science Forum Vols. 717-720 (2012) pp 929-932 it is known to arrange the p-n junction grid in form of a grid having a hexagonal cell pattern. Some cells consist of a large p-area without Schottky part to allow minority carrier injection without snapback phenomenon in the IV characteristic (negative differential resistance). The described JBS diode also includes a large $p^+$-type transmission region in the edge termination region. It is described that this large $p^+$-type transmission region in the edge termination region contribute first by minority carrier injection, whereas the smaller $p^+$-type hexagonal cells and the $p^+$-type grid follow only subsequently with increasing current density.

SUMMARY OF THE INVENTION

It is the object of the invention to provide a semiconductor power rectifier with increased surge current capability.

The object of the invention is attained by a semiconductor power rectifier according to claim 1. The semiconductor power rectifier according to the invention has a semiconductor layer having a first main side and a second main side opposite to the first main side. The semiconductor layer includes a drift layer having a first conductivity type, at least one pilot region having a second conductivity type different from the first conductivity type, a plurality of stripe-shaped emitter regions having the second conductivity type, and a transition region having the second conductivity type, wherein the at least one pilot region has in any lateral direction parallel to the first main side through a central point (for example the centroid of the area) a width of at least 200 µm and is formed adjacent to the first main side to form a first p-n junction with the drift layer, each emitter region is formed adjacent to the first main side form a second p-n junction with the drift layer, and the transition region is formed adjacent to the first main side to form a third p-n junction with the drift layer. In an orthogonal projection onto a plane parallel to the first main side, the transition region surrounds the pilot region and the plurality of stripe-shaped emitter regions. The semiconductor power rectifier also includes an electrode layer, which forms a Schottky contact with the drift layer and which forms an ohmic contact with the at least one pilot region, with the plurality of stripe-shaped emitter regions and with the transition region. The least one pilot region is connected to the transition region by the plurality of stripe-shaped emitter regions. Connecting the pilot region by the stripe-shaped emitter regions to the transition regions results in a switching on of the first and third p-n junctions nearly simultaneously, so that local heat generation in case of a surge current can be minimized. In particular, the third p-n junction is switched on with only a very short delay after the first p-n junction is switched on in case of a surge current.

The stripe-shaped emitter regions form a grid pattern. Exemplarily the grid pattern includes a plurality of first unit cells neighbouring with each other and having identical shapes, wherein in each first unit cell the strip-shaped emitter regions form a ring extending along the edges of the first unit cell and wherein two neighbouring first unit cells share a stripe-shaped emitter region. Exemplarily the first unit cells have the shape of hexagons, squares or triangles.

The inventive device further comprises a plurality of second unit cells having the same shape as the first unit cells, wherein the second unit cells have emitter regions continuously extending over a whole area of the second unit cell. Exemplarily at least some of the plurality of second unit cells are neighbouring with each other and are aligned along straight lines extending from the at least one pilot region to the transition region. Such design provides particular effective electrical connection between the pilot region and the transition region.

Further developments of the invention are specified in the dependent claims.

In an exemplary embodiment the stripe-shaped emitter regions form a plurality of continuous paths extending from the at least one pilot region to the transition region. In the exemplary embodiment the plurality of continuous paths provide a good electrical contact between the pilot region and the transition region via the stripe-shaped emitter regions to ensure a nearly simultaneous switching on of the first and third p-n junction in case of a surge current.

In an exemplary embodiment the stripe-shaped emitter regions include a plurality of emitter regions in the form of straight stripes extending from the pilot region to the transition region. The straight stripes provide an improved electrical connection between the pilot region and the transition region to further improve the surge current capability.

In an exemplary embodiment the stripe-shaped emitter regions form a grid pattern. Exemplarily the grid pattern includes a plurality of first unit cells neighbouring with each other and having identical shapes, wherein in each first unit cell the stripe-shaped emitter regions form a ring extending along the edges of the first unit cell and wherein two neighbouring first unit cells share a stripe-shaped emitter region. Exemplarily the first unit cells have the shape of hexagons, squares or triangles.

In an exemplary embodiment the device further comprises a plurality of second unit cells having the same shape as the first unit cells, wherein the second unit cells have emitter regions continuously extending over a whole area of the second unit cell. Exemplarily at least some of the plurality of second unit cells are neighbouring with each other and are aligned along straight lines extending from the at least one pilot region to the transition region. Such design provides particular effective electrical connection between the pilot region and the transition region.

In an exemplary embodiment the at least one pilot region is formed of at least two neighbouring second unit cells. Exemplarily the pilot region includes at least one central second unit cell, which is separated from any first unit cell by a group of second unit cells surrounding the central second unit cell in the orthogonal projection onto the plane parallel to the first main side.

In an exemplary embodiment each stripe-shaped emitter region (56; 56A to 56C; 156A to 156C; 756; 778) has, parallel to the first main side (52), a width of less than 20 µm.

In an exemplary the transition region has a width in a lateral direction of at least 20 µm, preferably of at least 100 µm.

In an exemplary embodiment the at least one pilot region, the stripe-shaped emitter regions and the transition region have all the same depth from the first main side and the same net doping concentration profile in a direction vertical to the first main side. This allows to generate the at least one pilot region, the stripe-shaped emitter regions and the transition region all at the same time, for example by implantation using only one single mask, or alternatively by selective etching a previously grown epitaxial layer or by trench etch and refill process.

In the orthogonal projection onto the plane parallel to the first main side, the ratio of a total Schottky contact area covered by all Schottky contact regions and an active area covered by the active region may be in a range of 30 to 90%.

BRIEF DESCRIPTION OF THE DRAWINGS

Detailed embodiments of the invention will be explained below with reference to the accompanying figures, in which:

FIG. 8 is a partial vertical cross section of a Junction Barrier Schottky (JBS) diode according to another embodiment.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF PREFERRED EMBODIMENTS

Figure 1:
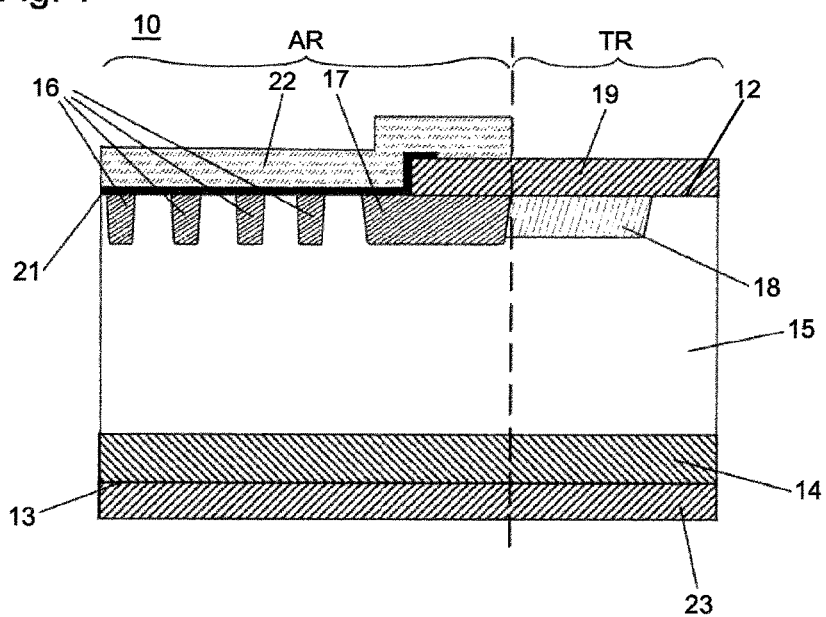
FIG. 1 is a partial vertical cross section of a Junction Barrier Schottky (JBS) diode.
Figure 2:
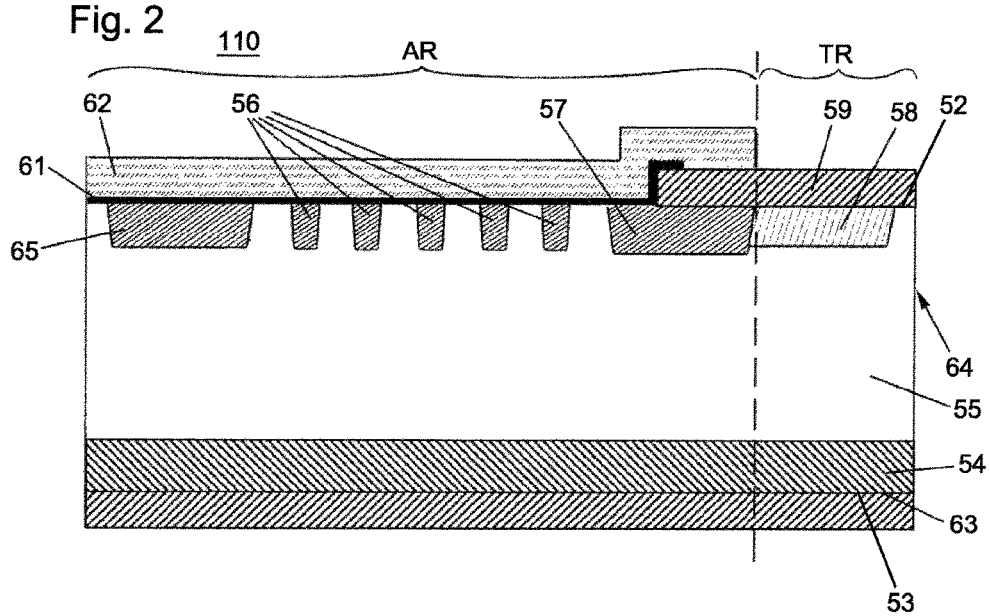
FIG. 2 is a partial vertical cross section of a Junction Barrier Schottky (JBS) diode according to an example useful to understand the invention.

In FIG. 2 a partial vertical cross section of a semiconductor power rectifier 110 according to a first embodiment is shown. The partial vertical cross section shown in FIG. 2 is taken along a line AA' in FIG. 3. The semiconductor power rectifier 110 according to the first embodiment is SiC JBS diode, which comprises a SiC semiconductor wafer 64 having a first main side 52 and a second main side 53. In an orthogonal projection onto a plane parallel to the first main side 52, the semiconductor wafer 64 has an active region AR surrounded by an edge termination region TR. In the order from the second main side 53 to the first main side 52, the semiconductor wafer 64 includes an $n^+$-type cathode layer 54 and an $n^-$-type drift layer 55. In the center of the device a $p^+$-type pilot region 65 is formed adjacent to the first main side 52 to form a first p-n junction with the drift layer 55. Further, a plurality of $p^+$-type emitter regions 56 are formed in the drift layer 55 adjacent to the first main side 52 to form a second p-n junction with the drift layer 55, respectively, and a $p^+$-type transition region 57 is formed adjacent to the first main side 52 in the active region AR along the boundary between the active region AR and the edge termination region TR to form a third p-n junction with the drift layer 55. In the edge termination region TR a p-type junction termination extension (JTE) region 18 is formed adjacent to the first main side 52. On the first main side 52 a passivation layer 59 is formed in the edge termination region TR and overlaps with the transition region 57 in the orthogonal projection onto the plane parallel to the first main side 52. In the active area AR the first main side 52 is covered by metal electrode layer 61 forming a Schottky contact with the $n^-$-type drift layer 55 and forming an ohmic contact with the $p^+$-type emitter regions 56 and with the $p^+$-type transition region 57. A top metal 62 is formed on the metal electrode layer 61. The metal electrode layer 61 and the top metal 62 overlap with and extend onto the passivation layer 59. On the second main side 53 there is formed a backside metallization 63 as an anode electrode.

The peak doping concentration of the pilot region 65, the emitter regions 56 and the transition region is in a range between $1·10^{17}$ cm$^{-3}$ and $1·10^{20}$ cm$^{-3}$, respectively. The depth of the pilot region 65, the emitter regions 56 and the transition region is in a range between 0.3 µm and 5 µm, respectively. The pilot region 65, the emitter regions 56 and the transition region may all have the same depth from the first main side 52 and the same net doping concentration profile in a direction vertical to the first main side 52. In particular, the pilot region 65, the emitter regions 56 and the transition region 57 may all have the same peak doping concentration. This allows to generate the pilot region 65, the stripe-shaped emitter regions 56 and the transition region 57 all at the same time, for example by implantation using only one single mask, or alternatively by selective etching a previously grown epitaxial layer or by a trench etch and refill process.

Figure 3A:
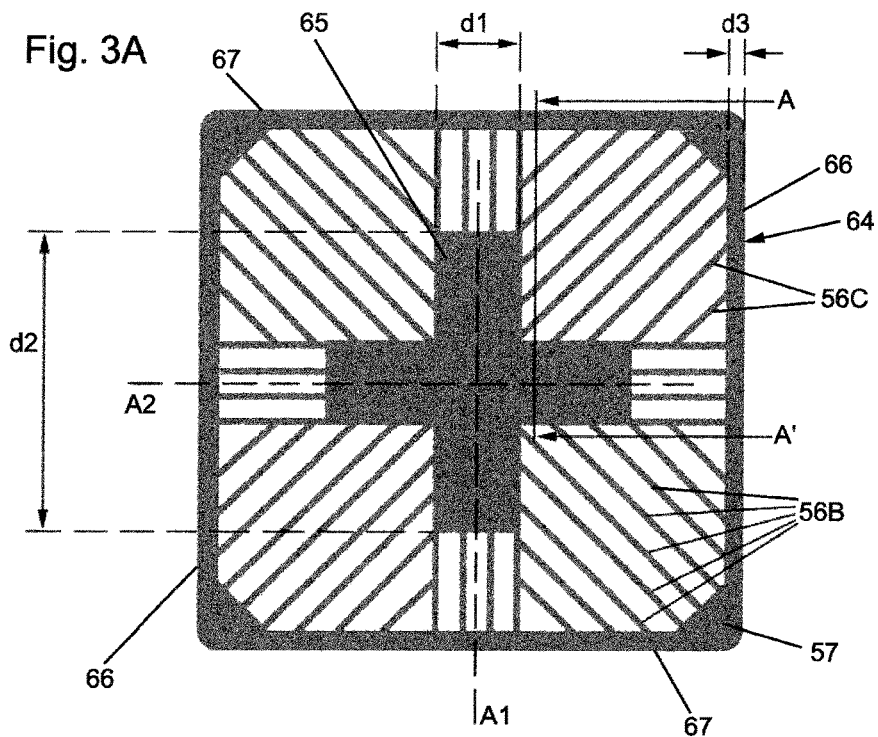
FIG. 3A is a horizontal cross section of the JBS diode as shown in FIG. 2 along a plane parallel to and adjacent to a first main side of a semiconductor wafer.
Figure 3B:
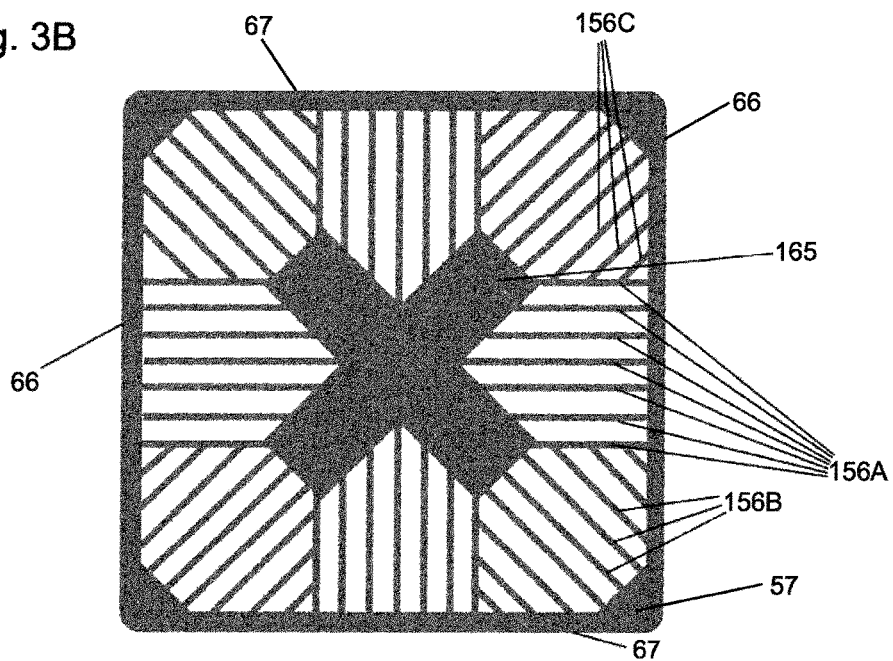
FIG. 3B is a horizontal cross section of a JBS diode according to a first modification of the first embodiment along a plane parallel to and adjacent to a first main side of a semiconductor wafer.

The pattern formed by the pilot region 65, the emitter regions 56 and the transition region 57 in a horizontal cross section can be seen from FIG. 3A, which shows a horizontal cross section of the SiC JBS diode 110 along a plane parallel to and adjacent to the first main side 52. This pattern corresponds to a pattern of the first to third p-n junctions. The semiconductor wafer 64 has a square shape and the transition region 57 is formed along a boundary between the active region AR and the termination region TR to surround the pilot region 65 and the plurality of stripe-shaped emitter regions 56 as shown in FIG. 3A. Throughout the specification a stripe-shaped region is any long, narrow region extending along a line, wherein the length of the region along the line is at least double of a width of the region in a direction perpendicular to that line. Each stripe-shaped emitter region 56 has, parallel to the first main side 52, a width of less than 20 µm. The width of the transition region 57 in a lateral direction parallel to the first main side 52 and perpendicular to the edge of the active region AR is at least 20 µm, exemplarily at least 100 µm, and exemplarily less than 200 µm.

The pilot region 65 has the shape of a cross with a first main axis A1 extending parallel to first side 66 of the square shaped device and a second main axis A2 extending parallel to a second side 67 of the square shaped device. The cross is formed by two identical rectangular regions crossing each other. Each rectangular region has a length d2 and a width d1. The width d1 may be in a range between 20 and 2000 µm, exemplarily in a range between 100 µm and 2000 µm, more exemplarily in a range between 200 µm and 1000 µm. The width d2 may be in a range between 100 µm and 5 mm, exemplarily in a range between 500 µm and 5 mm, and more exemplarily in a range between 1 mm and 5 mm. The pilot region may have in any lateral direction parallel to the first main side through a central point (for example the centroid of the area) a width of at least 200 µm.

The stripe-shaped emitter regions 56 include a plurality of first emitter regions 56A and 56B which are formed as straight stripes extending from the pilot region 65 to the transition region 57. Of these first emitter regions 56A and 56B, the first emitter regions 56A extend in a direction perpendicular to one of the sides 67, 66 of the square shaped device, respectively. Other first emitter regions 56B of these first emitter regions 56A and 56B extend in a direction inclined by 45° relative to the side surface 66 or 67, respectively. The stripe-shaped emitter regions 56 include in addition second emitter regions 56C which also have a straight stripe shape but bifurcate and extend from the first emitter regions 56A at an angle of 45° to the transition region 57. The stripe-shaped emitter regions 56 include groups, each group including a plurality of stripe-shaped emitter regions 56 arranged in parallel with each other at a regular distance.

In an orthogonal projection onto a plane parallel to the first main side, the ratio of a total Schottky contact area covered by all Schottky contact regions and an active area covered by the active region may be in a range of 30 to 90%. In this range a low threshold voltage similar to that of a Schottky diode and good blocking characteristics similar to a p-i-n diode can be achieved at the same time.

In operation the SiC JBS diode 110 has good blocking characteristics due to the fact that the depletion region, which extends from the first to third p-n junctions under reverse bias conditions can protect the Schottky contact regions between neighbouring stripe-shaped $p^+$-type emitter regions 56, from a high electric field, which could eventually result in premature breakdown due to increased leakage currents. The depletion layer extending from each pair of two neighbouring stripe-shaped $p^+$-type emitter regions 56 can pinch off the Schottky contact between these two neighbouring stripe-shaped $p^+$-type emitter layer regions 56.

In the JBS diode as shown in FIGS. 2 and 3A the Schottky contacts have a lower threshold voltage than the first to third p-n junctions. Therefore, during normal operation (flow of a current equal to or below the nominal current), under a relatively low forward bias, the current conduction is governed by the unipolar current flow through the Schottky contacts. In case of a surge current a higher voltage drop will develop over the device and the first to third p-n junctions switch into on-state so that bipolar current can flow through these first to third p-n junctions. The electrical resistance of the p-n junctions is lower than that of the Schottky junction when holes are injected through the p-n junction into the drift layer. Accordingly, the p-n junctions allow the flow of higher surge currents than a SiC Schottky diode without any p-n junctions. Due to the straight emitter regions 56A, 56B and 56C physically and electrically connecting the pilot region 65 to the transition region 57, the first and the third p-n junctions are switched on nearly simultaneously in case of a surge current and excessive heat generation due to localized current flow can be prevented. In particular the straight first emitter regions 56A and 56B which provide a continuous straight path between the pilot region 65 and the transition region 57 can provide a particular good electrical and physical connection between the pilot region 65 and the transition region 57 via a continuous p-type region formed by the emitter regions 56. Due to the relatively large width of the pilot region 65 in any lateral direction in a plane parallel to the first main side 52, which is relatively larger than the width of the stripe-shaped emitter regions 56 and of the transition region 57 the first p-n junction formed between the pilot region 65 and the drift layer 55 switches on at first in case of a surge current. However, in the JBS diode 110 according to the first embodiment of the invention, the third p-n junction formed between the transition region 57 and the drift layer 55 is switched on with only very short delay after the first p-n junction is switched on in case of a surge current.

Here, it is to be noted that the electrical connection between the pilot region 65 and the transition region 57 via the electrode layer 61 and the top metal 62 alone does not have the same effect as the electrical and physical connection between the pilot region 65 and the transition region 57 via the continuous p-type region formed by the emitter regions 56. The inventor found out that without a direct electric connection between the pilot region 65 and the transition region 57 via a continuous path formed by the p-type emitter regions 56, there is a significant delay between the switching on of the first and the third p-n junctions.

In FIGS. 3B to 3G there are shown first to sixth modifications of the first embodiment. Due to the many similarities between the first embodiment as described with FIGS. 2 and 3A and the first to sixth modifications of the first embodiment, respectively, a description of features which are the same will not be repeated and it is referred to the above description of the first embodiment. In particular, elements having the same reference signs have the same features throughout the specification. In the following only features are described which differ from that of the above described first embodiment.

The first modification of the first embodiment differs from the first embodiment shown in FIG. 3A in that it has a cross-shaped pilot region 165 which is similar to the cross-shaped pilot region 65 but is, in an orthogonal projection onto a plane parallel to the first main side 52, rotated by a rotation angle of 45° relative to the transition region 57. The dimensions of the cross-shaped pilot region 165 may otherwise be the same as that of the cross-shaped pilot region 65. The first modification of the first embodiment includes stripe-shaped $p^+$-type emitter regions 156A, 157B, 156C, which are similar to the stripe-shaped $p^+$-type emitter regions 56 in the first embodiment. However, due to the different orientation the pilot region 165, they have a slightly different length and the number of stripe-shaped $p^+$-type emitter regions 156A, 157B, 156C in each group of parallel stripe-shaped $p^+$-type emitter regions 156A, 157B, 156C is different from the number in each group of parallel stripe-shaped $p^+$-type emitter regions 56 in the first embodiment.

Similar to the first embodiment, the stripe-shaped $p^+$-type emitter regions 156A, 157B, 156C include a plurality of first emitter regions 156A and 156B which are formed as straight stripes extending from the pilot region 165 to the transition region 57. Of these first emitter regions 156A and 156B, the first emitter regions 156A extend in a direction perpendicular to one of the sides 67, 66 of the square shaped device, respectively. Other first emitter regions 156B of these first emitter regions 156A and 156B extend in a direction inclined by 45° relative to the side surface 66 or 67, respectively. The stripe-shaped emitter regions 156A, 157B, 156C include in addition second emitter regions 156C which also have a straight stripe shape but extend from the first emitter regions 156A at an angle of 45° to the transition region 57. The stripe-shaped emitter regions 156A, 157B, 156C are arranged in groups, each group including a plurality of stripe-shaped emitter regions 156A, 157B, 156C arranged in parallel with each other at a regular distance.

Figure 3C:
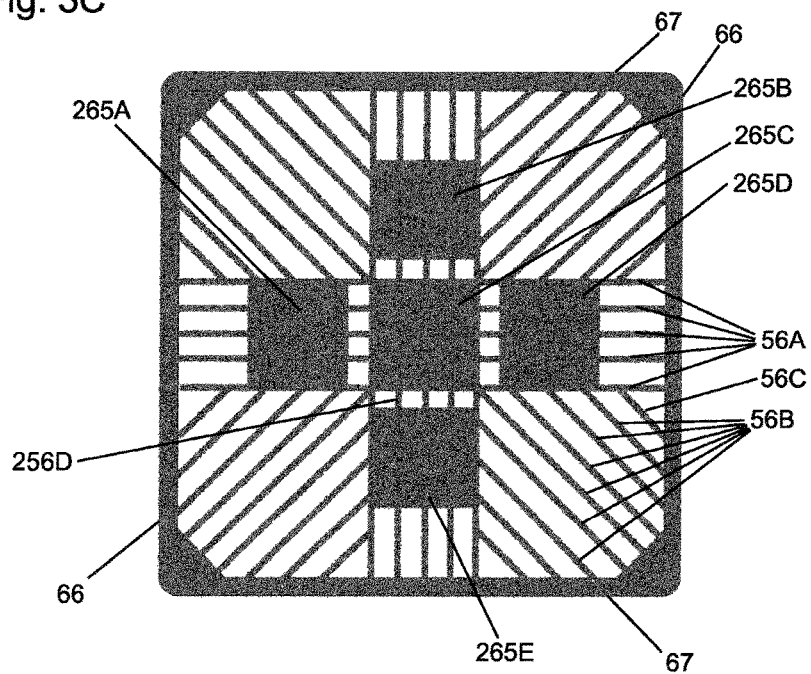
FIG. 3C is a horizontal cross section of a JBS diode according to a second modification of the first embodiment along a plane parallel to and adjacent to a first main side of a semiconductor wafer.

The second modification of the first embodiment as shown in FIG. 3C differs from the first embodiment shown in FIG. 3A in that there are provided five individual pilot regions 265A to 265E instead of only on pilot region 65. The five individual pilot regions 265A to 265E are connected with each other via a plurality of straight stripe-shaped $p^+$-type emitter regions 256D and form a cross similar to the shape of the cross-shaped pilot region 65 in the first embodiment. Each square-shaped pilot region 265A to 265E may have in any lateral direction parallel to the first main side through a central point (for example the centroid of the area) a width of at least 200 μm.

Figure 3D:
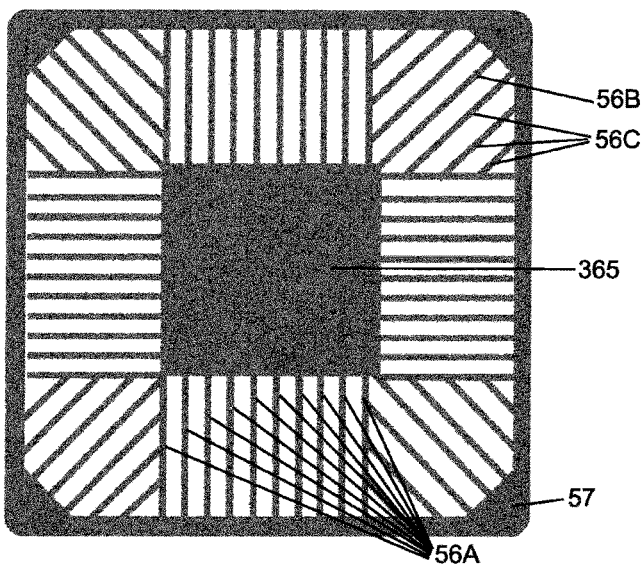
FIG. 3D is a horizontal cross section of a JBS diode according to a third modification of the first embodiment along a plane parallel to and adjacent to a first main side of a semiconductor wafer.

The third modification of the first embodiment as shown in FIG. 3D differs from the first embodiment shown in FIG. 3A in that the pilot region 365 has, in a projection onto a plane parallel to the first main side 52 a square shape. The square-shaped pilot region 365 may have in any lateral direction parallel to the first main side through a central point (for example the centroid of the area) a width of at least 200 μm.

Figure 3E:
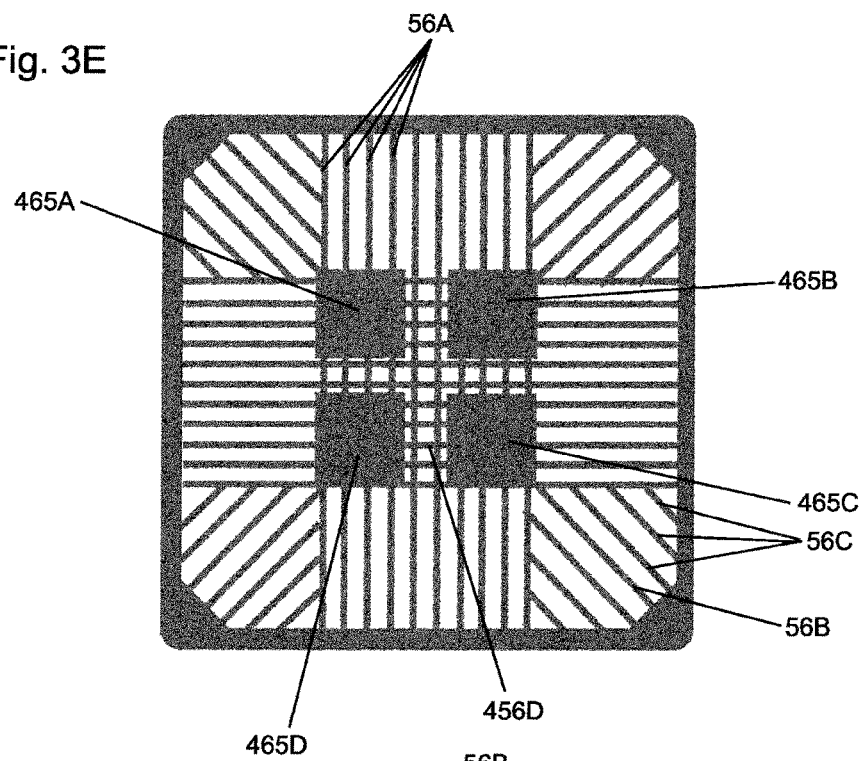
FIG. 3E is a horizontal cross section of a JBS diode according to a fourth modification of the first embodiment along a plane parallel to and adjacent to a first main side of a semiconductor wafer.

The fourth modification of the first embodiment as shown in FIG. 3E differs from the third modification of the first embodiment shown in FIG. 3E in that there are provided four individual pilot regions 465A to 465D instead of only on pilot region 365. The four individual pilot regions 465A to 465D are connected with each other via a plurality of straight stripe-shaped $p^+$-type emitter regions 456D and form a square similar to the shape of the square-shaped pilot region 365 in the third modification of the first embodiment. Each square-shaped pilot region may have in any lateral direction parallel to the first main side through a central point (for example the centroid of the area) a width of at least 200 μm.

Figure 3F:
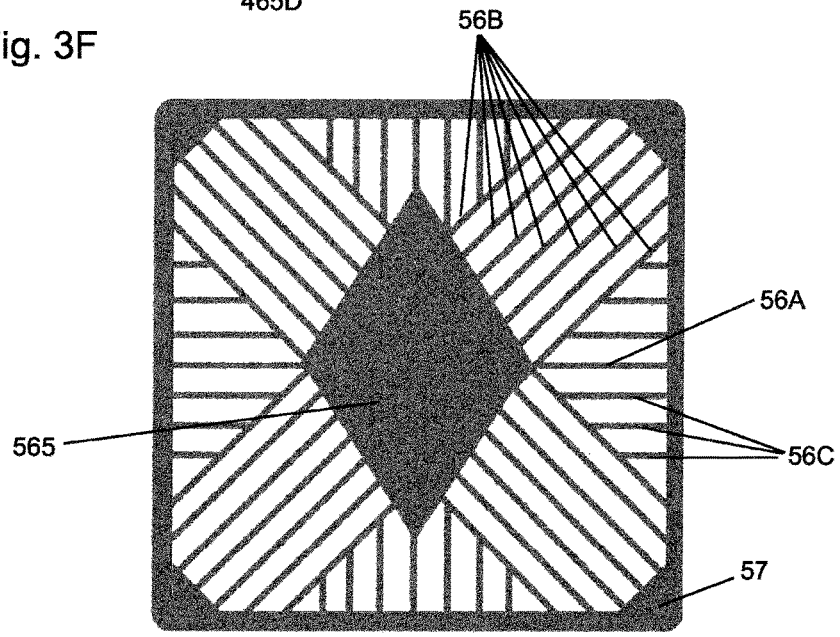
FIG. 3F is a horizontal cross section of a JBS diode according to a fifth modification of the first embodiment along a plane parallel to and adjacent to a first main side of a semiconductor wafer.

The fifth modification of the first embodiment as shown in FIG. 3F differs from the first embodiment shown in FIG. 3A in that the pilot region 565 has, in a projection onto a plane parallel to the first main side 52 a diamond shape. The diamond-shaped pilot region 565 may have in any lateral direction parallel to the first main side through a central point (for example the centroid of the area) a width of at least 200 μm.

Figure 3G:
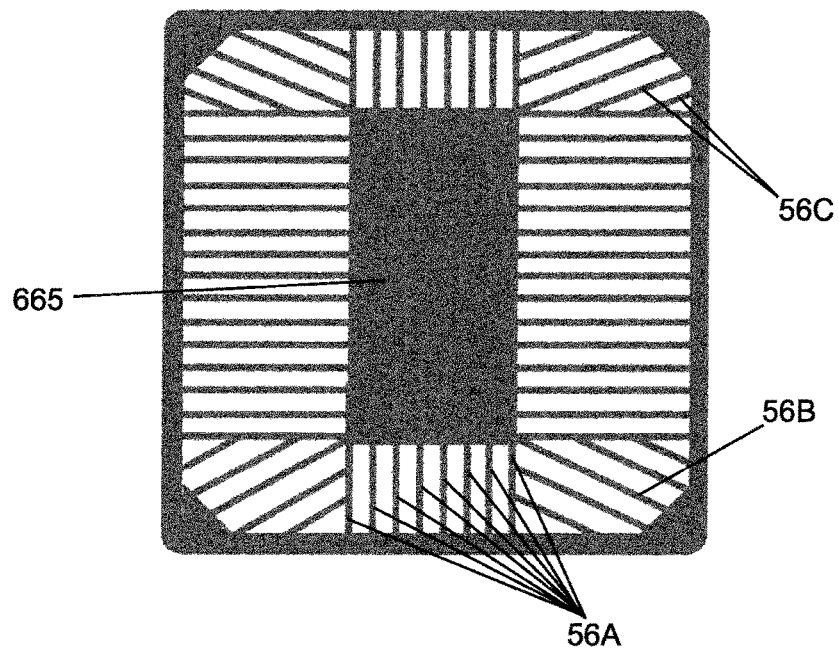
FIG. 3G is a horizontal cross section of a JBS diode according to a sixth modification of the first embodiment along a plane parallel to and adjacent to a first main side of a semiconductor wafer.

The sixth modification of the first embodiment as shown in FIG. 3G differs from the first embodiment shown in FIG. 3A in that the pilot region 665 has, in a projection onto a plane parallel to the first main side 52 a rectangular shape. The rectangular-shaped pilot region 665 may have in any lateral direction parallel to the first main side through a central point (for example the centroid of the area) a width of at least 200 μm.

Next there will be described a JBS diode according to a second embodiment with reference to FIG. 4, which shows a horizontal cross section of the JBS diode 710, and FIG. 5 which shows a partial perspective view of a section of the JBS diode 710 near a first main side (anode side) of the device.

The JBS diode 710 according to the second embodiment is similar to the JBS diode 110 according to the first embodiment. Therefore, only features of the JBS diode 710 which are different from the JBS diode 110 will be described in the following.

The JBS diode 710 according to the second embodiment differs from the JBS diode 110 according to the first embodiment in that the pattern of the stripe-shaped $p^+$-type emitter regions 756 corresponding to the stripe-shaped emitter regions 56 in the first embodiment are arranged to form a grid pattern having a plurality of identical hexagonal first unit cells 700 neighboring with each other. On the left side of FIG. 4 there is shown an enlarged section A of the grid pattern. In section A there is included one complete hexagonal first unit cell 700 surrounded by six neighboring first unit cells 700A to 700F, of which only a part is included in section A, respectively. In each first unit cell 700 the stripe-shaped emitter regions 756 form a ring extending along the edges of the first unit cell 700 and wherein each pair of two neighboring first unit cells (for example unit cells 700 and 700A in section A) share a stripe-shaped emitter region 756. In each first unit cell the ring formed by the stripe-shaped emitter regions 756 surrounds a continuous Schottky contact region in an orthogonal projection onto a plane parallel to the first main side 52.

In an orthogonal projection onto a plane parallel to the first main side 52, a pilot region 765 is formed in the center of the device of the JBS diode 710 similar to the pilot region 65 in the first embodiment. The pilot region 765 differs from the pilot region 65 only in its shape in the orthogonal projection onto the plane parallel to the first main side 52. As can be seen in FIG. 4 the pilot region 765 includes a plurality of neighboring second unit cells 766 having the same shape as the first unit cells 700, wherein the second unit cells 766 have emitter regions continuously extending over a whole area of the second unit cell 766. As in the first embodiment, the pilot region 765 may have in any lateral direction parallel to the first main side through a central point (for example the centroid of the area) a width of at least 200 µm. In particular, the pilot region 765 includes at least one central second unit cell 766, which is separated from any first unit cell 700 by a group of second unit cells 766 surrounding the central second unit cell 766 in the orthogonal projection onto the plane parallel to the first main side 52.

In the second embodiment the grid pattern of stripe-shaped emitter regions 756 provide an electrical and physical connection between the pilot region 765 and the transition region 57 via a continuous p-type region formed by the stripe-shaped emitter regions 756. In particular, a plurality of continuous paths extending from the pilot region 765 to the transition region 57 are formed in the second embodiment similar to the first embodiment.

It is to be noted that a vertical cross section through the JBS diode 710 is similar to the cross section shown in FIG. 2. For reasons of conciseness, it is refrained from repeating a description thereof.

The JBS diode 710 according to the second embodiment provides similar advantages as does the JBS 110 according to the first embodiment.

In FIGS. 6A to 6H there are shown first to eighth modifications of the second embodiment. Due to the many similarities between the second embodiment as described with FIGS. 4 and 5 and the first to eighth modifications of the second embodiment, respectively, a description of features which are the same will not be repeated and it is referred to the above description of the second embodiment. In the following only features, which differ from that of the above described second embodiment, will be described.

Figure 4:
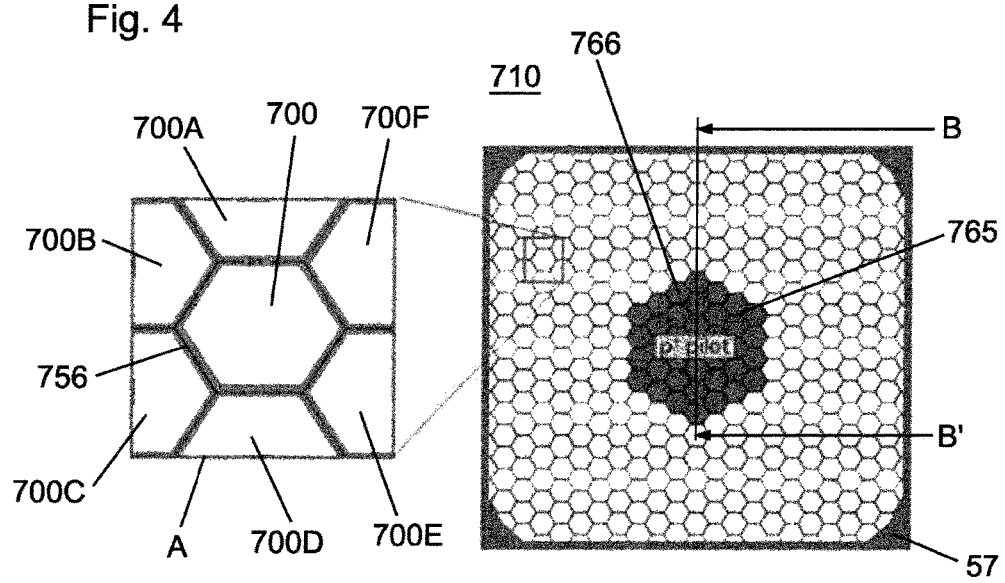
FIG. 4 is a horizontal cross section of a JBS diode according to a second comparative example useful to understand the invention along a plane parallel to and adjacent to a first main side of a semiconductor wafer.
Figure 5:
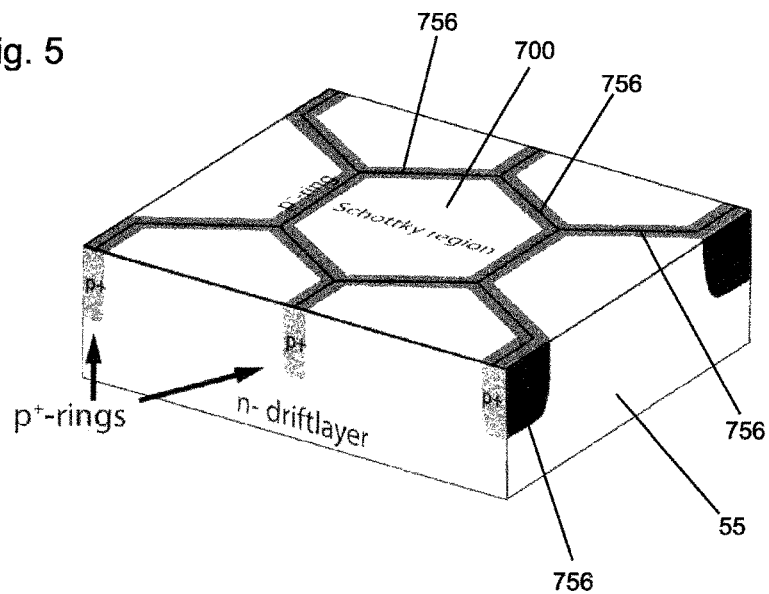
FIG. 5 is a partial sectional view of the JBS diode according to the second comparative example near the first main side.
Figure 6A:
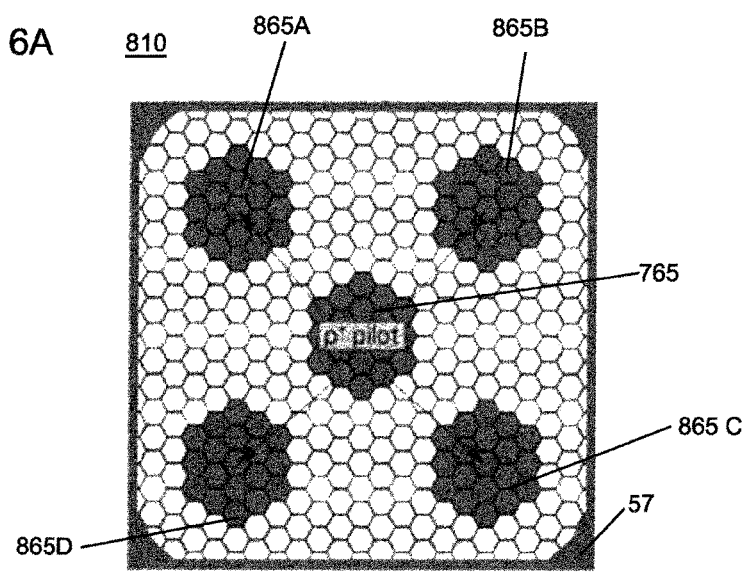
FIG. 6A is a horizontal cross section of a JBS diode according to a first modification of the second embodiment along a plane parallel to and adjacent to a first main side of a semiconductor wafer.

The JBS diode 810 according to a first modification of the second embodiment as shown in FIG. 6A differs from the JBS diode 710 according to the second embodiment as shown in FIGS. 4 and 5 only in that in addition to the pilot region 765 in the center of the device, there are provided four additional pilot regions 865A to 865D around the pilot region 765 in the center. The additional pilot regions 865A have the same features and in particular the same shape as the pilot region 765 in the center.

Figure 6B:
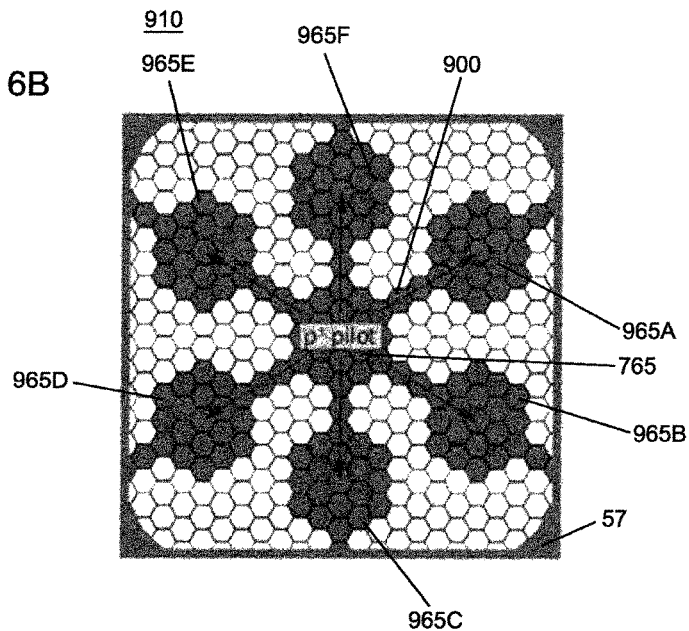
FIG. 6B is a horizontal cross section of a JBS diode according to a second modification of the second embodiment along a plane parallel to and adjacent to a first main side of a semiconductor wafer.

The JBS diode 910 according to a second modification of the second embodiment as shown in FIG. 6B differs from the JBS diode 810 according to the first modification of the second embodiment as shown in FIG. 6A only in that in addition to the pilot region 765 in the center of the device, there are provided six additional pilot regions 965A to 965F instead of four additional pilot regions 865A to 865D around the pilot region 765 in the center, and in that it comprises additional second unit cells 766, which are neighbouring with each other and are aligned along straight lines 900 extending from the central pilot region 765, through one of the additional pilot regions 965A to 965F, respectively, to the transition region 57. The additional pilot regions 965A to 965F have the same features and in particular the same shape as the pilot region 765 in the center. The design of the provides a particular effective electrical connection between the pilot region and the transition region to improve the surge current capability of the JBS diode 910.

Figure 6C:
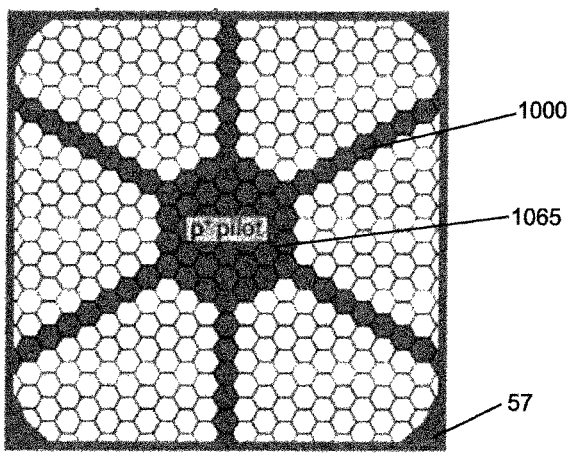
FIG. 6C is a horizontal cross section of a JBS diode according to a third modification of the second embodiment along a plane parallel to and adjacent to a first main side of a semiconductor wafer.

The JBS diode 1010 according to a third modification of the second embodiment as shown in FIG. 6C differs from the JBS diode 910 according to the second modification of the second embodiment as shown in FIG. 6B only in that the pilot region 1065 in the center of the device has a larger width than that of the pilot region 765 and in that there are provided no additional pilot regions around the single pilot region 1065 in the center. Similar to the second modification it comprises additional second unit cells 766, which are neighbouring with each other and are aligned along straight lines 1000 extending from the central pilot region 1065 to the transition region 57. Such design provides a particular effective electrical connection between the single pilot region 1065 in the center and the transition region 57 to improve the surge current capability of the JBS diode 1010.

Figure 6D:
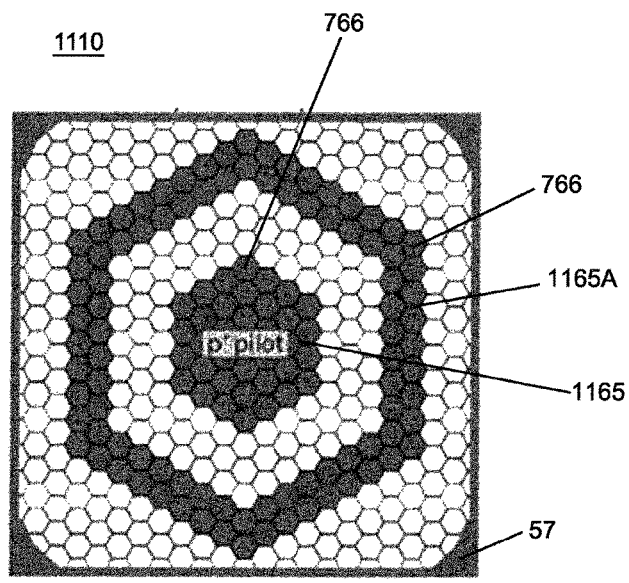
FIG. 6D is a horizontal cross section of a JBS diode according to a fourth modification of the second embodiment along a plane parallel to and adjacent to a first main side of a semiconductor wafer.

The JBS diode 1110 according to a fourth modification of the second embodiment as shown in FIG. 6D differs from the JBS diode 710 according to the second embodiment as shown in FIGS. 4 and 5 only in that the pilot region 1165 includes a larger number of second unit cells 766 and in that there is provided an additional pilot region 1165A in the form of a ring made up of a plurality of second unit cells 766.

Figure 6E:
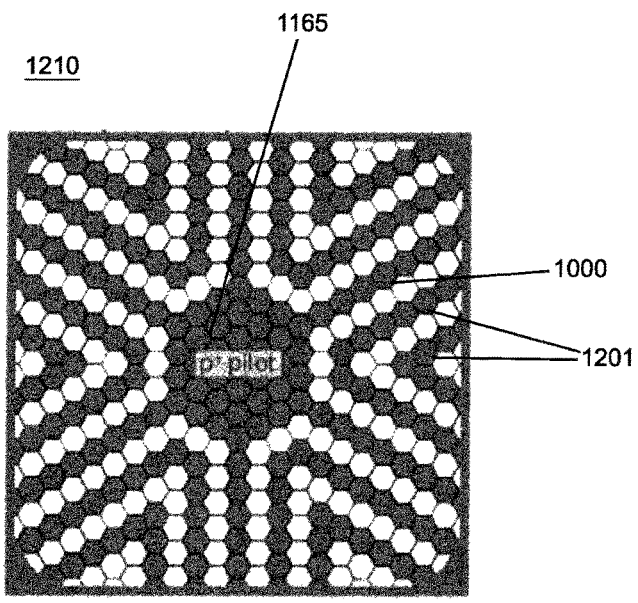
FIG. 6E is a horizontal cross section of a JBS diode according to a fifth modification of the second embodiment along a plane parallel to and adjacent to a first main side of a semiconductor wafer.

The JBS diode 1210 according to a fifth modification of the second embodiment as shown in FIG. 6E differs from the JBS diode 1010 according to the third modification of the second embodiment as shown in FIG. 6C only in that there are provided additional lines 1201 of neighbouring second unit cells 766, wherein the additional lines 1201 extend in a radial direction from the center of the device to the transition region 57 but are, in contrast to the lines 1000, not directly connected to the pilot region 1165.

Figure 6F:
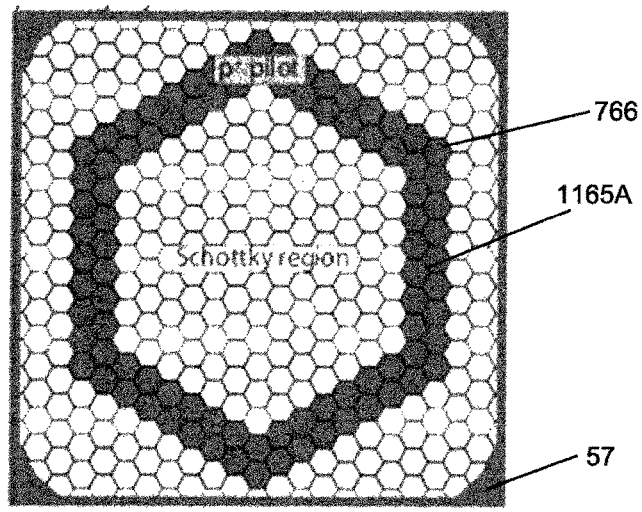
FIG. 6F is a horizontal cross section of a JBS diode according to a sixth modification of the second embodiment along a plane parallel to and adjacent to a first main side of a semiconductor wafer.

The JBS diode 1310 according to a sixth modification of the second embodiment as shown in FIG. 6F differs from the JBS diode 1110 according to the fourth modification of the second embodiment as shown in FIG. 6D only in that it is missing its pilot region 1165 in the center.

Figure 6G:
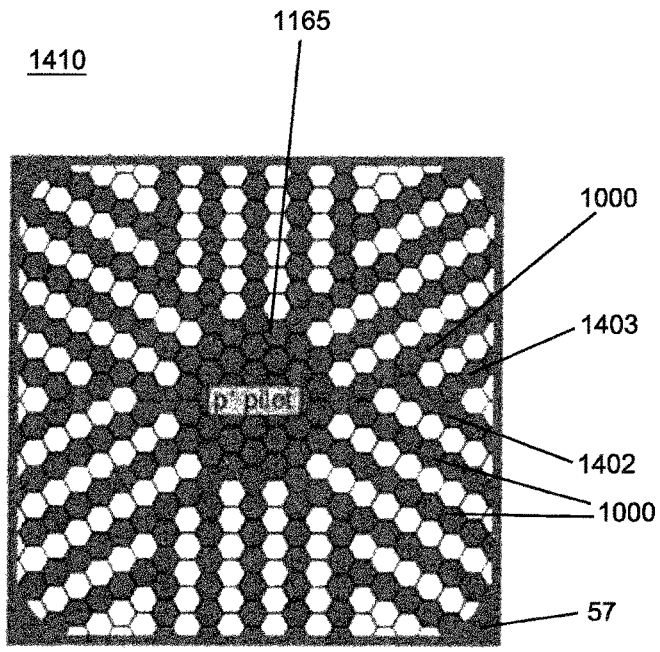
FIG. 6G is a horizontal cross section of a JBS diode according to a seventh modification of the second embodiment along a plane parallel to and adjacent to a first main side of a semiconductor wafer.

The JBS diode 1410 according to a seventh modification of the second embodiment as shown in FIG. 6G differs from the JBS diode 1210 according to the fifth modification of the second embodiment as shown in FIG. 6E only in that includes more straight lines 1000 of neighbouring second unit cells 766 extending from the pilot region 1165 in the center to the transition region 57, in that it includes in addition lines 1402 inclined to and bifurcating from one of these lines 1000, from which it is extending to the transition region 57, in that it includes also in addition lines 1403 inclined to and bifurcating from one of these lines 1402, from which it extends to the transition region 57.

Figure 6H:
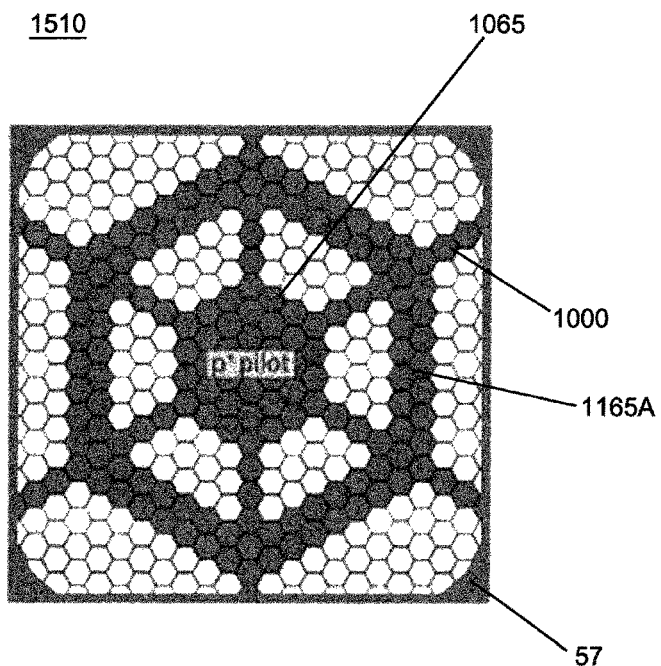
FIG. 6H is a horizontal cross section of a JBS diode according to an eighth modification of the second embodiment along a plane parallel to and adjacent to a first main side of a semiconductor wafer.

The JBS diode 1510 according to an eighth modification of the second embodiment as shown in FIG. 6H differs from the JBS diodes 1310 according to the third modification of the second embodiment as shown in FIG. 6C only in that it includes in addition the ring 1165A of second unit cells 766 as in the fourth or sixth modifications of the second embodiment, for example.

In another inventive embodiment, the electrode layer 21 comprises in the orthogonal projection onto the plane parallel to the first main an electrode trench extension 210, which extends into at least one pilot region 65; 165; 265A-265E; 365; 465A-465D; 565; 665; 765; 865A-865D; 965A-965F; 1065; 1165, 1165A. The electrode trench extension 210 is surrounded by said at least one pilot region 65; 165; 265A-265E; 365; 465A-465D; 565; 665; 765; 865A-865D; 965A-965F; 1065; 1165, 1165A. It is surrounded at the lateral sides (perpendicular to the first main side) and at the bottom side (towards the second main side). A depth of the at least one electrode trench extension 210 is less than a depth of said at least one pilot region 65; 165; 265A-265E; 365; 465A-465D; 565; 665; 765; 865A-865D; 965A-965F; 1065; 1165, 1165A, i.e. the pilot region separates the electrode trench extension 210 from the drift layer 55.

The inventive device may comprise one or more such electrode trench extensions 210. Exemplarily, the depth of the at least one electrode trench extension 210 is between 0.1 to 0.8 of the depth of said at least one pilot region 65; 165; 265A-265E; 365; 465A-465D; 565; 665; 765; 865A-865D; 965A-965F; 1065; 1165, 1165A. In another exemplary embodiment, the at least one electrode trench extension 210 has a width, which is at least one of at least 0.8 μm. In another exemplary embodiment, the at least one electrode trench extension 210 has a width of at most 0.8 times a width of said at least one pilot region 65; 165; 265A-265E; 365; 465A-465D; 565; 665; 765; 865A-865D; 965A-965F; 1065; 1165, 1165A. The width of the electrode trench extension 210 shall be the maximum diameter of a circle that may be laid into the electrode trench extension in a plane parallel to the first main side. In another exemplary embodiment, the electrode trench extension 210 is surrounded by the at least one pilot region, wherein the at least one pilot region has a width at the first main sided surface of at least 0.1 times the total width of the at least one pilot region (the widths being defined like the width of the electrode trench extensions), i.e. the electrode trench extension has a distance from the drift layer 55 in a plane parallel to the first main side of at least 0.1 times the width of the pilot region.

Such electrode trench extension 210 may additionally also be available at any of the stripe-shaped emitter regions 56; 56A to 56C; 156A to 156C; 756; 778. The electrode trench extension 210 or extensions extend into at least one stripe-shaped emitter region 56; 56A to 56C; 156A to 156C; 756; 778. It is surrounded by said at least one stripe-shaped emitter region 56; 56A to 56C; 156A to 156C; 756; 778, wherein the depth of the at least one electrode trench extension 210 is less than a depth of said at least one stripe-shaped emitter region 56; 56A to 56C; 156A to 156C; 756; 778. The at least one electrode trench extension 210 may have a width, which is at least one of at least 0.6 μm and at most 0.8 times a width of said at least one stripe-shaped emitter region 56; 56A to 56C; 156A to 156C; 756; 778.

For an inventive device having second unit cells 766, such electrode trench extensions 210 may also be extend into the emitter regions, but all electrode trench extensions 210 are separated from the drift layer 55 by a region of the second conductivity type (pilot region, stripe-shapes emitter region or emitter region).

Figure 7A:
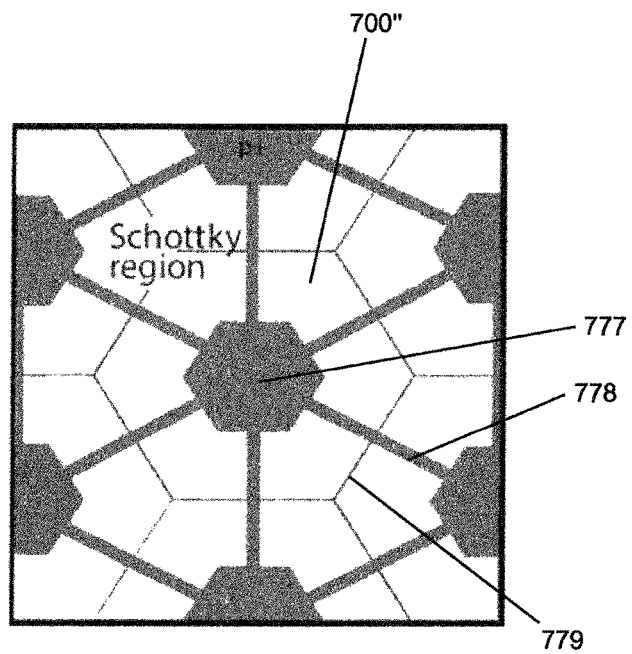
FIG. 7A is partial horizontal cross section of a JBS diode according to an ninth modification of the second embodiment along a plane parallel to and adjacent to a first main side of a semiconductor wafer.
Figure 7B:
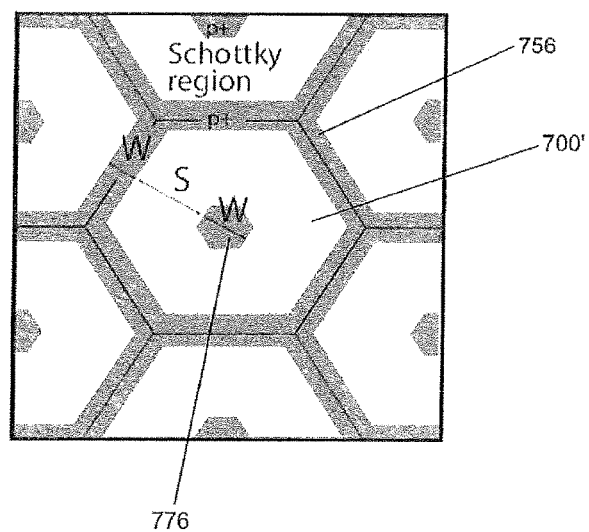
FIG. 7B is partial horizontal cross section of a JBS diode according to an tenth modification of the second embodiment along a plane parallel to and adjacent to a first main side of a semiconductor wafer.
Figure 7B:
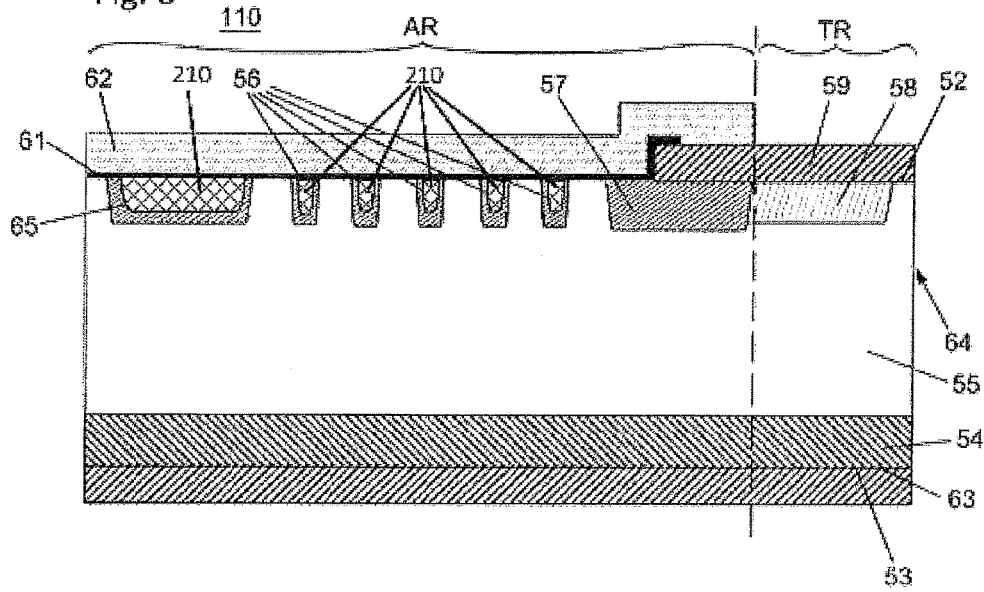

In the description above, specific embodiments of the invention were described. However, alternatives and modifications of the above described embodiments are possible. In particular, in the above second embodiments and its first to eight modification, the JBS diode was described with hexagonal first unit cells 700 and second unit cells 766. However, the first unit cells 700 and the second unit cells 766 may have also any other shape, such as the shape of squares or triangles. In addition, the first unit cells 700 may have an additional emitter region 776, 777 in its center as shown in FIGS. 7A and 7B. Also, the stripe-shaped emitter regions 756 may not necessarily be positioned along the sides 779 of the unit cells as in the second embodiment. For example stripe-shaped p$^+$-type emitter regions 778 may extend through the middle of the sides 779 of the hexagonal unit cell 700', respectively, as shown in FIG. 7A.

In the above described embodiments, the semiconductor wafer was described to be rectangular. However, the semiconductor wafer, which corresponds to the semiconductor layer in the claims, does not necessarily have to be rectangular. It can also be circular.

The above embodiments were explained with specific conductivity types. The conductivity types of the semiconductor layers and regions in the above described embodiments might be switched, so that all layers or regions which were described as p-type would be n-type and all layers or regions which were described as n-type would be p-type.

In the above described embodiments a SiC wafer is used. However, the semiconductor layer of the semiconductor power rectifier may be made of any other appropriate semiconductor material, in particular including wide band gap semiconductor materials, such as group-III-nitrides.

It should be noted that the term "comprising" does not exclude other elements or steps and that the indefinite article "a" or "an" does not exclude the plural. Also elements described in association with different embodiments may be combined.

LIST OF REFERENCE SIGNS

10 SiC JBS diode
12 first main side
13 second main side
14 n$^+$-type cathode layer
15 n$^-$-type drift layer
16 p$^+$-type emitter layer portions
17 p$^+$-type transition region
18 p-type junction termination extension (JTE) region
19 passivation layer
21 metal electrode layer
210 electrode trench extension
22 top metal
23 backside metallization
52 first main side
53 second main side
54 n$^+$-type cathode layer
55 n$^-$-type drift layer
56 p$^+$-type emitter region
56A first emitter regions
56B first emitter regions
56C second emitter regions
57 p$^+$-type transition region
58 p-type junction termination extension (JTE) region
59 passivation layer
61 metal electrode layer
62 top metal
63 backside metallization
64 (SiC) semiconductor wafer
65 pilot region
66 first side
67 second side
110 semiconductor power rectifier according to a first embodiment (SiC JBS diode)
156A stripe-shaped p$^+$-type first emitter regions
156B stripe-shaped p$^+$-type first emitter regions
156C stripe-shaped p$^+$-type second emitter regions
165 pilot region
256D stripe-shaped p$^+$-type emitter regions
265A pilot region
265B pilot region
265C pilot region
265D pilot region
265E pilot region
265F pilot region
365 pilot region
465A pilot region
465B pilot region
465C pilot region
465D pilot region
565 pilot region
665 pilot region
700 first unit cell 700' first unit cell
700" first unit cell
700A first unit cell
700B first unit cell
700C first unit cell
700D first unit cell
700E first unit cell
700F first unit cell
710 JBS diode according to a second embodiment
756 stripe-shaped p⁺-type emitter regions
765 pilot region
766 second unit cells
776 additional emitter region
777 additional emitter region
778 stripe-shaped p⁺-type emitter regions
779 sides of the unit cells
810 JBS diode according to a first modification of the second embodiment
865A additional pilot region
865B additional pilot region
865C additional pilot region
865D additional pilot region
900 straight line
910 JBS diode according to a second modification of the second embodiment
965A additional pilot region
965B additional pilot region
965C additional pilot region
965D additional pilot region
965E additional pilot region
965F additional pilot region
1000 straight lines
1010 JBS diode according to a third modification of the second embodiment
1065 pilot region
1110 JBS diode according to a fourth modification of the second embodiment
1165 pilot region
1165A ring
1201 line
1210 JBS diode according to a fifth modification of the second embodiment
1310 JBS diode according to a sixth modification of the second embodiment
1402 line
1403 line
1410 JBS diode according to a seventh modification of the second embodiment
1510 JBS diode according to an eighth modification of the second embodiment
A1 first main axis
A2 second main axis
d1 length
d2 width
AR active region
TR edge termination region

The invention claimed is:

1. A power semiconductor rectifier comprising:
   a semiconductor layer having a first main side and a second main side opposite to the first main side, the semiconductor layer including:
      a drift layer having a first conductivity type;
      at least one pilot region having a second conductivity type different from the first conductivity type, wherein the at least one pilot region is formed adjacent to the first main side and forms a first p-n junction with the drift layer;
      a plurality of stripe-shaped emitter regions having the second conductivity type, wherein each emitter region is formed adjacent to the first main side and forms a second p-n junction with the drift layer; and
      a transition region having the second conductivity type, which is formed adjacent to the first main side and forms a third p-n junction with the drift layer, and which, in an orthogonal projection onto a plane parallel to the first main side, surrounds the at least one pilot region and the plurality of stripe-shaped emitter regions,
   an electrode layer, which forms a Schottky contact with the drift layer and which forms on ohmic contact with the at least one pilot region, with the plurality of stripe-shaped emitter regions and with the transition region,
   wherein the at least one pilot region is connected to the transition region by the plurality of stripe-shaped emitter regions, wherein
   the stripe-shaped emitter regions form a grid pattern,
   the grid pattern includes a plurality of first unit cells neighboring with each other and having identical shapes, wherein in each first unit cell the strip-shaped emitter regions form a ring extending along the edges of the first unit cell and two neighboring first unit cells share a stripe-shaped emitter region, and a plurality of second unit cells having the same shape as the first unit cells, wherein the second unit cells have emitter regions continuously extending over a whole area of the second unit cell,
   the at least one pilot region has in any lateral direction parallel to the first main side a width of at least 200 μm, which is measured along a line passing through a central point of the pilot region; and
   at least some of the plurality of second unit cells are neighboring with and adjacent to each other and are aligned along straight lines extending from the at least one pilot region to the transition region.

2. The power semiconductor rectifier according to claim 1, wherein the stripe-shaped emitter regions form a plurality of continuous paths extending from the at least one pilot region to the transition region.

3. The power semiconductor rectifier according to claim 2, wherein the first unit cells have the shape of hexagons, squares or triangles.

4. The power semiconductor rectifier according to claim 2, wherein the at least one pilot region is formed of at least two neighbouring second unit cells.

5. The power semiconductor rectifier according to claim 2, wherein the at least one pilot region includes at least one central second unit cell, which is separated from any first unit cell by a group of second unit cells surrounding the central second unit cell in the orthogonal projection onto the plane parallel to the first main side.

6. The power semiconductor rectifier according to claim 2, wherein the transition region has a width in a lateral direction parallel to the first main side of at least 20 μm.

7. The power semiconductor rectifier according to claim 1, wherein the first unit cells have the shape of hexagons, squares or triangles.

8. The power semiconductor rectifier according to claim 7, wherein the at least one pilot region is formed of at least two neighbouring second unit cells.

9. The power semiconductor rectifier according to claim 1, wherein the at least one pilot region is formed of at least two neighbouring second unit cells.

10. The power semiconductor rectifier according to claim 1, wherein the at least one pilot region includes at least one central second unit cell, which is separated from any first unit cell by a group of second unit cells surrounding the central second unit cell in the orthogonal projection onto the plane parallel to the first main side.

11. The power semiconductor rectifier according to claim 1, wherein the transition region has a width in a lateral direction parallel to the first main side of at least 20 μm.

12. The power semiconductor rectifier according to claim 1, wherein the transition region has a width in a lateral direction of at least 100 μm.

13. The power semiconductor rectifier according to claim 1, wherein the at least one pilot region, the stripe-shaped emitter regions and the transition region have all the same depth from the first main side and the same net doping concentration profile in a direction vertical to the first main side.

14. The power semiconductor rectifier according to claim 1, wherein each stripe-shaped emitter region has, parallel to the first main side, a width of less than 20 μm.

15. The power semiconductor rectifier according to claim 1, wherein, in the orthogonal projection onto the plane parallel to the first main side, the ratio of a total Schottky contact area covered by all Schottky contact regions and an active area covered by an active region is in a range of 30 to 90%.

16. The power semiconductor rectifier according to claim 1, wherein, in the orthogonal projection onto the plane parallel to the first main side, the electrode layer comprises at least one electrode trench extension, which extends into at least one pilot region and is surrounded by said at least one pilot region, wherein the depth of the at least one electrode trench extension is less than a depth of said at least one pilot region.

17. The power semiconductor rectifier according to claim 16, wherein the depth of the at least one electrode trench extension is between 0.1 to 0.8 of the depth of said at least one pilot region.

18. The power semiconductor rectifier according to claim 16, wherein the at least one electrode trench extension has a width, which is at least one of at least 0.8 μm and at most 0.8 times a width of said at least one pilot region.

19. The power semiconductor rectifier according to claim 16, wherein, in the orthogonal projection onto the plane parallel to the first main side, the electrode layer comprises at least one electrode trench extension, which extends into at least one stripe-shaped emitter region and is surrounded by at least one stripe-shaped emitter region, wherein the depth of the at least one electrode trench extension is less than a depth of said at least one stripe-shaped emitter region.

20. The power semiconductor rectifier according to claim 19, wherein the at least one electrode trench extension has a width, which is at least one of at least 0.6 μm and at most 0.8 times a width of said at least one stripe-shaped emitter region.

* * * * *